United States Patent [19]
DeWalch et al.

[11] Patent Number: 6,032,989
[45] Date of Patent: Mar. 7, 2000

[54] METER LOCKING RING FOR USE WITH MULTIPLE LOCKS

[76] Inventors: Norman Binz DeWalch, 3179 Las Palmas, Houston, Tex. 77027; Jeffrey Mark Davis, 1700 Seaspray Ct., #2164, Houston, Tex. 77008

[21] Appl. No.: 09/080,833

[22] Filed: May 18, 1998

[51] Int. Cl.[7] .................................................. B65D 45/30
[52] U.S. Cl. ........................... 292/256.6; 292/327; 70/19; 70/DIG. 63; 70/168
[58] Field of Search ................................. 292/256.6, 327; 70/DIG. 63, 14, 19, 18, 180, 232, 163, 166–168, 169

[56] References Cited

U.S. PATENT DOCUMENTS

| | | | |
|---|---|---|---|
| 256,079 | 4/1882 | Trackwell | 70/18 |
| 2,963,895 | 12/1960 | Thomas | 70/18 |
| 3,867,822 | 2/1975 | Morse et al. | |
| 3,889,497 | 6/1975 | Tuttle | 70/14 |
| 3,913,959 | 10/1975 | Larkin | 292/256.6 |
| 3,988,031 | 10/1976 | Meyer | 292/153 |
| 4,008,585 | 2/1977 | Lundberg | |
| 4,085,599 | 4/1978 | Fischer et al. | 70/14 |
| 4,329,860 | 5/1982 | Moberg | |
| 4,331,012 | 5/1982 | Swisher | 70/164 |
| 4,413,490 | 11/1983 | Nielsen, Jr. | |
| 4,415,190 | 11/1983 | Finck, Jr. et al. | |
| 4,446,603 | 5/1984 | Guiler | |
| 4,543,807 | 10/1985 | Swishen | |
| 4,674,304 | 6/1987 | Guiler | |
| 4,697,443 | 10/1987 | Hillin | 70/121 |
| 4,742,703 | 5/1988 | De Walch | |
| 4,828,300 | 5/1989 | Agbay | |
| 5,001,912 | 3/1991 | De Walch | |
| 5,121,953 | 6/1992 | Mahaney | |
| 5,475,993 | 12/1995 | Kuo | 70/18 |
| 5,542,722 | 8/1996 | De Walch | |
| 5,613,386 | 3/1997 | Mire, Sr. | 70/232 |
| 5,642,635 | 7/1997 | Wen-Chyun | 70/46 |
| 5,743,116 | 4/1998 | Suster | 70/14 |

*Primary Examiner*—Darnell M. Boucher
*Assistant Examiner*—Clifford B Vaterlaus
*Attorney, Agent, or Firm*—Jeffrey M. Davis

[57] ABSTRACT

A locking ring includes two semi-annular ring portions with a U-shaped cross section. The locking ring serves to retain an electric meter in its meter socket in a manner which is well known. Both ends of each ring portion terminate in housings, each housing having an axial lock receiving aperture therethrough. When the ring halves are brought together to form a complete circle, the clockwise-most and counter-clockwise-most housings slide over each other until their lock receiving apertures are in axial alignment. A barrel lock can then be inserted into each of the two sets of aligned apertures, to secure the locking ring against opening. When a barrel lock is removed from either set of apertures, the ring can be opened at that location and removed from the meter.

11 Claims, 8 Drawing Sheets

METER LOCKING RING FOR USE WITH MULTIPLE LOCKS

BACKGROUND

1. Field of the Invention

The present invention relates in general to locking rings for securing electricity meters, and more specifically to a meter locking ring with two or more receptacles therein for receiving a plurality of barrel type locks.

2. Problems Addressed by the Invention

In the electric utility industry, meter locking rings and barrel locks are utilized to deter vandals and to prevent potential power thieves from stealing electricity by altering electricity meter readings or bypassing the meters entirely. Locking rings, such as the one shown in U.S. Pat. No. 5,542,722 (1996, DeWalch), are used to secure the electricity meters to the meter bases. These rings usually comprise an annular split ring with a generally U-shaped cross section, and a lock receiving assembly which prevents separation of the ends of the split ring when secured with a barrel type lock such as the disc tumbler lock shown in U.S. Pat. No. 4,742,703 (1988, DeWalch et al) or the plunger style lock shown in U.S. Pat. No. 4,543,807 (1985, Swisher). A particular style of barrel lock and key is also referred to as a locking system. It should be noted that many more locking systems in addition to those listed here are available. Furthermore, many of these locking systems can be individually coded, resulting in literally thousands of potential permutations of locking systems and codes.

Until recently, the separate functions of power generation, distribution, metering, and billing in most regions of the U.S. were performed by a single entity, usually the local utility distribution company (UDC). Deregulation of the electric power utility industry in many areas has resulted in the distribution of these functions among several independent entities. For example, power generation, distribution and customer service might be handled by an energy service provider (ESP), while meter installation would be done by the metering service provider (MSP). In this and many other similar situations, it often becomes necessary for the UDC, ESP and MSP all to have independent access to the electricity meters.

Usually the UDC will secure each meter in its socket with a meter ring of the type described above, and then lock the ring with a barrel lock from a particular locking system. In order to gain access to these meters, all service/installation personnel from the ESP or MSP must be provided with keys for that locking system. However, some ESPs and MSPs may supply services to dozens of UDCs, with each UDC selecting its own locking system. In such a situation, the ESP or MSP service personnel must be provided with a separate key for the locking system of every UDC they service. To further complicate the issue, the UDCs periodically update their lock codes or even change locking systems all together, requiring the ESPs and MSPs to retrain their service personnel and supply them with additional keys for the new locking system.

Given the vast number of locking systems and codes available, it is easy to see the potential for confusion and costly delays inherent in this scenario. What is needed is a method for securing electricity meters which utilizes a plurality of barrel locks, thereby allowing the UDC, ESP and MSP to select their locking systems independently, and to have independent access to the meters. This would allow the ESP or MSP to standardize on a single locking system for all of the meters it services, thereby greatly reducing the number of keys which must be supplied to its service personnel, and enhancing the timeliness and efficiency of service. The situation may also arise where two or more entities desire joint access, rather than independent access, to the meters. Therefore, several alternative embodiment meter rings are presented which utilize multiple barrel locks, but which require removal of several or all said barrel locks to open the meter ring.

Discussion of Prior Art

In order to provide background information so that the invention may be completely understood in its proper context, reference is made to the following articles of prior art. In many locking rings, such as the ones shown in U.S. Pat. No. 4,413,490 (1983, Nielsen, Jr.), U.S. Pat. No. 4,008,585 (1977, Lundberg), U.S. Pat. No. 4,674,304 (1987, Guiler), U.S. Pat. No. 3,867,822 (1975, Morse et al.), and U.S. Pat. No. 4,329,860 (1982, Moberg), the ends of the annular split ring portion are held together by a screw. A single barrel lock is then used to secure a separate protective housing which covers the ends of the split ring and prevents access to the screw.

Another type of locking ring has a male portion at one end and a female portion at the other end. A single barrel lock is used to directly secure the male and female portions together. Examples of this type of locking ring are shown in U.S. Pat. No. 4,828,300 (1989, Agbay), U.S. Pat. No. 4,446,603 (1984, Guiler), and U.S. Pat. No. 4,415,190 (1983, Finck, Jr. et al). The locking ring shown in the U.S. Pat. No. 5,542,722 (DeWalch) has overlapping portions on each end which are retained together by a single barrel lock. Whatever the precise merits, features, and advantages of the above cited references, they do not achieve or fulfill the purposes or objects of the present invention as set forth below.

SUMMARY OF THE INVENTION

Objects of the Invention

Accordingly, several objects and advantages of the present invention are:

(a) To provide a locking ring which is adapted to receive a plurality of barrel locks, and can be opened by unlocking and removing any one of said barrel locks.

(b) To provide a locking ring which is adapted to receive a plurality of barrel locks, and requires removal of at least two of said barrel locks before opening.

(c) To provide a locking ring which provides a high level of security.

(d) To provide a locking ring which comprises a minimum of parts.

Brief Physical Description

The locking ring of the present invention comprises two semi-annular ring halves, each with a U-shaped cross section, which fit over the radially extending, circular flanges of an electricity meter and base, and secure the meter to the base in a manner which is well known. Each end of each ring half is formed into an L-shaped wall portion, with the longer leg of each wall portion extending radially outward. The shorter legs extend generally perpendicularly to the longer legs and towards the open side of the ring half to which it is attached. Each short leg terminates in a serration. When the two halves of the locking ring are brought together to form a full circle, the complimentary serrations on the end portions intermesh at two diametrically opposed locations. The L-shaped wall portions form two diametrically opposed, generally rectangular enclosures. The U-shaped cross section of the ring material continues throughout the L-shaped protrusions, so that there is an internal lip along both the front and rear perimeters of the two rectangular enclosures.

On each ring half, the counter-clockwise most L-shaped wall portion combines with a substantially solid rear housing to form a rear end protrusion. Similarly, the clockwise most L-shaped wall portion combines with a substantially solid front portion to form a front end protrusion. Each of the four housings contains a hole for receiving the barrel lock and an external groove for receiving a lip of the ring material, and each housing has the same general shape as the rectangular enclosure. On each ring half, the rear internal lip of the counter-clockwise most L-shaped wall portion fits into the groove on its respective rear housing. Similarly, the front internal lip of the clockwise most L-shaped wall portion fits into the groove on its respective front housing. When the locking ring is installed on the meter, the two halves of the ring are brought together, and each front housing slides over the rear housing on the other ring half until the lock receiving holes in the housings align to receive the barrel locks. In this configuration, the external groove in each front housing receives the front internal lip from the counter-clockwise most protrusion, and the external groove in each rear housing receives the rear internal lip from the clockwise most protrusion.

Each front housing includes a generally conical lock guard portion. Each rear housing has an internal ball receiving groove for retaining the locking balls of a barrel lock. When the barrel locks are installed, they prevent the two halves of the meter ring from being separated, and thus secure the ring to the meter. When a barrel lock is removed from either set of housings, the meter ring can be opened at that location, and removed from the meter.

Present Invention vs. Prior Art

The locking ring of the present invention comprises two separate lock receiving openings. All of the prior art meter rings are adapted to receive only a single barrel lock.

How the Present Invention Fulfills the Objects

The locking ring of the present invention comprises two separate lock receiving openings. These lock receiving openings are configured such that removal of either lock allows the ring to be opened at that point and removed from the meter. The lock receiving openings are defined by axially symmetric front and rear housings, which can be turned from bar stock. The overlapping housing design of the present invention offers a high level of security, because pry points have been minimized. Each of the ring halves comprises a single assembly, such that a completed ring has only two components, exclusive of the lock. Alternative embodiments of the present invention, which are also adapted to receive a plurality of barrel locks, further require that more than one lock be removed before the meter ring can be opened.

DETAILED DESCRIPTION OF THE PREFERRED EMBODIMENT

Figure 1:
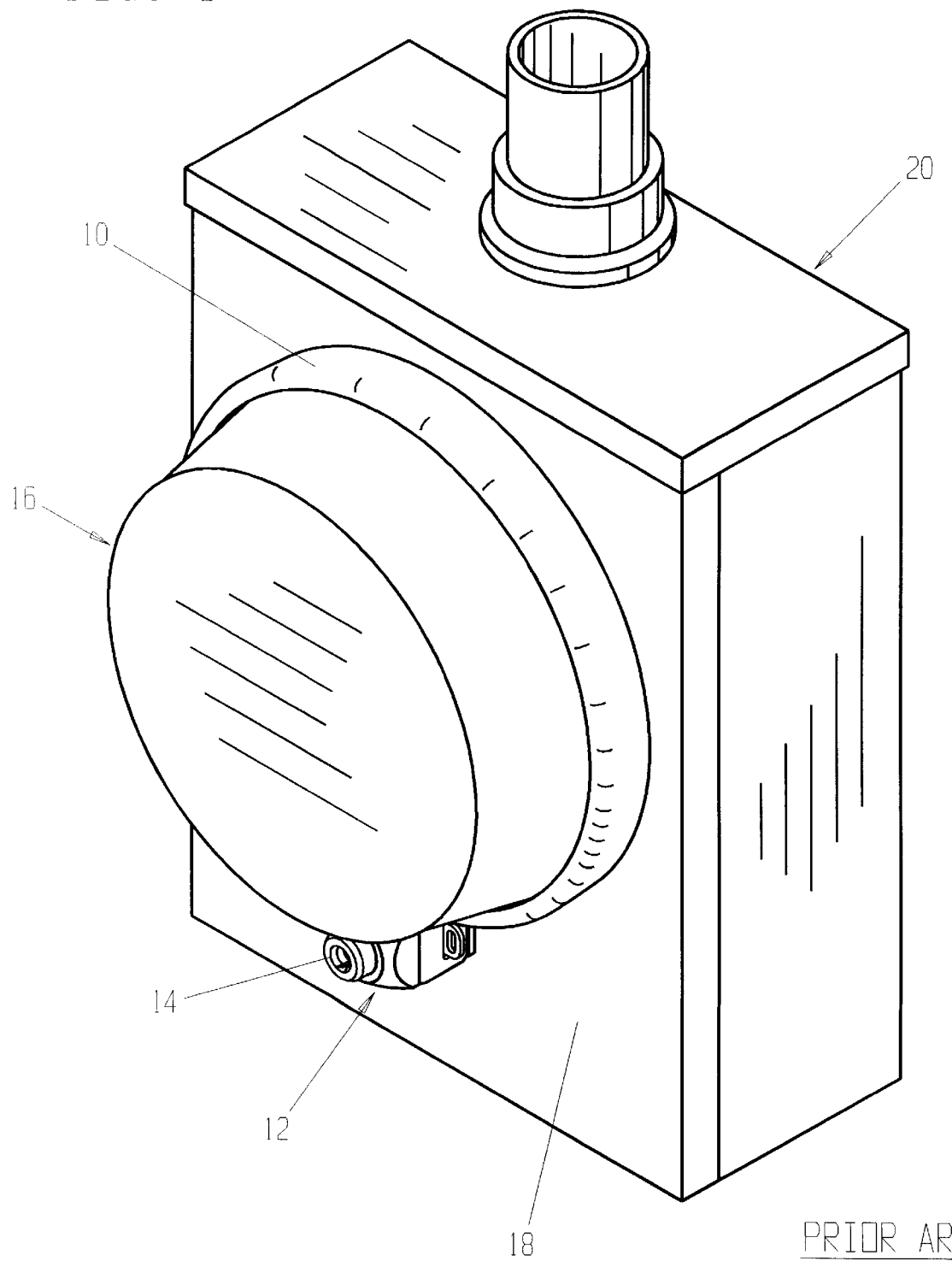
FIG. 1 shows an isometric view of a prior art locking ring installed on an electricity meter.

FIG. 1 shows a prior art meter ring comprising a one piece ring portion 10 and a housing assembly 12 adapted to receive a single barrel type lock 14. The ring portion retains the meter 16 to the door 18 of the meter box 20 in a manner which is well known. Upon removal of the barrel lock, the ends of the ring portion can be separated, and the meter ring can be removed from the meter.

Figure 2:
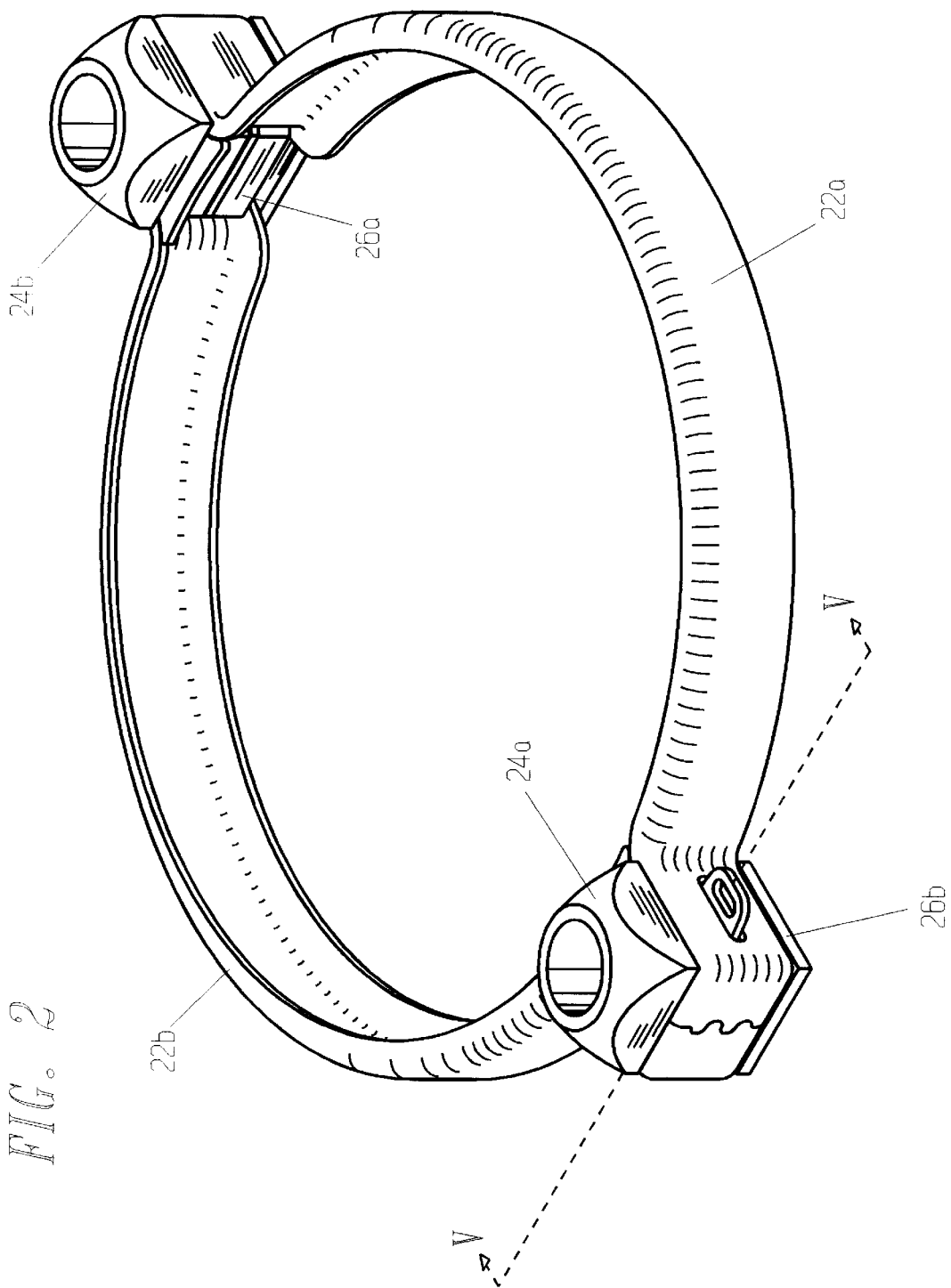
FIG. 2 shows an isometric view of the preferred embodiment locking ring.
Figure 3:
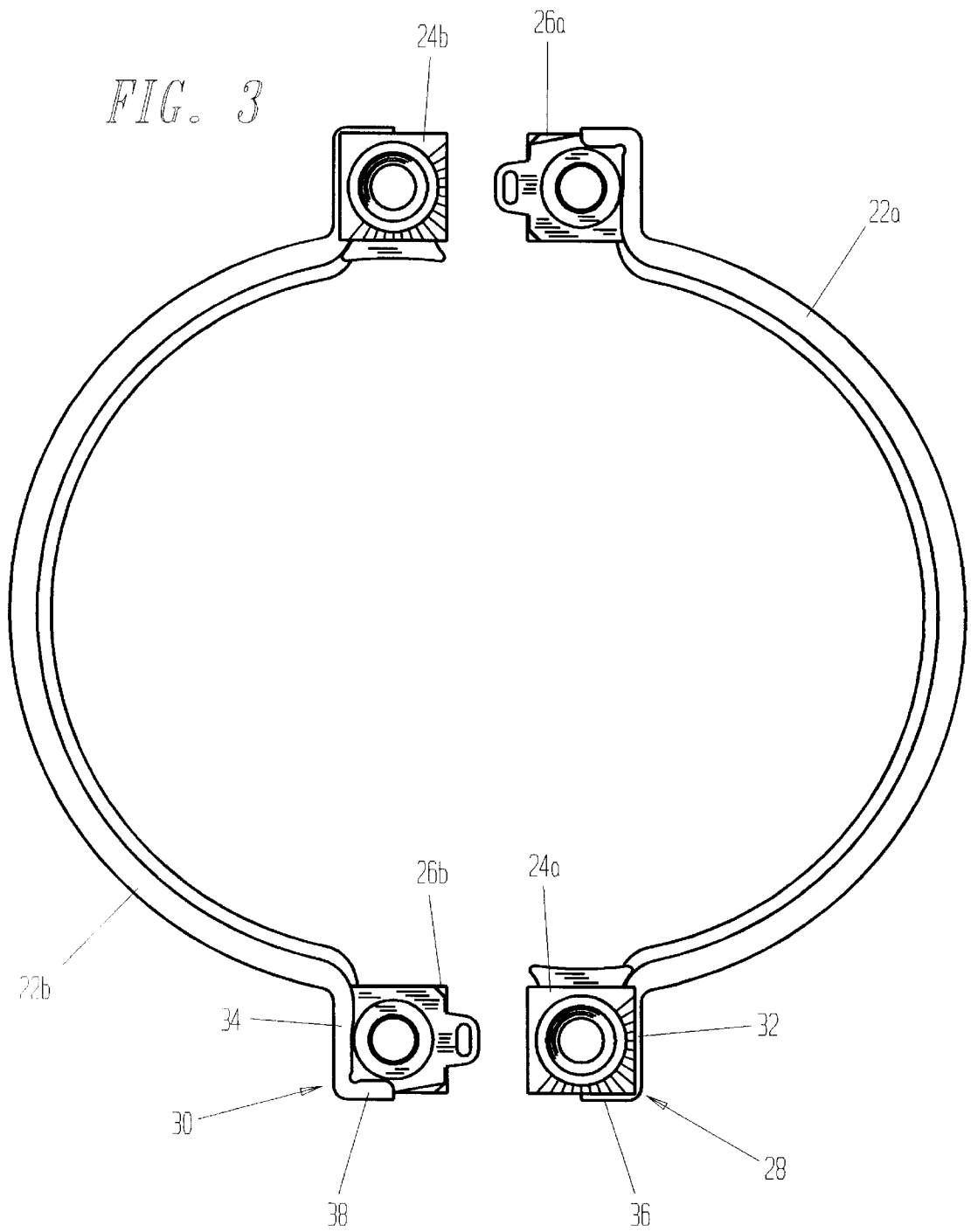
FIG. 3 shows a top view of the preferred embodiment locking ring in the open position.
Figure 4:
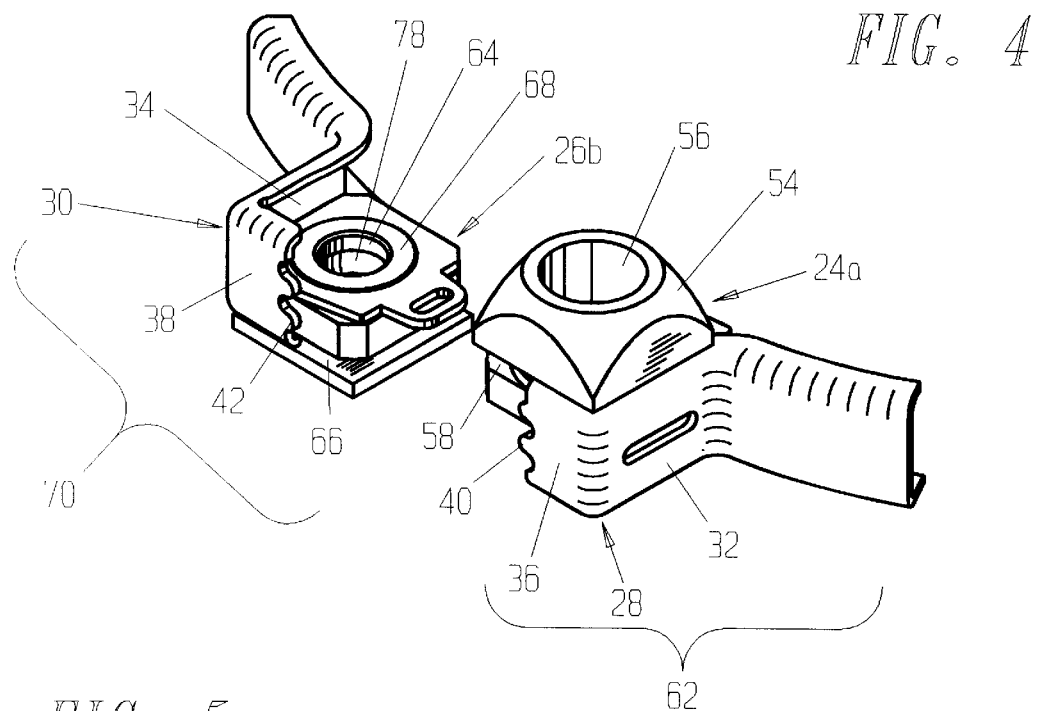
FIG. 4 shows an isometric view of one set of the preferred embodiment locking ring ends in the open position.
Figure 5:
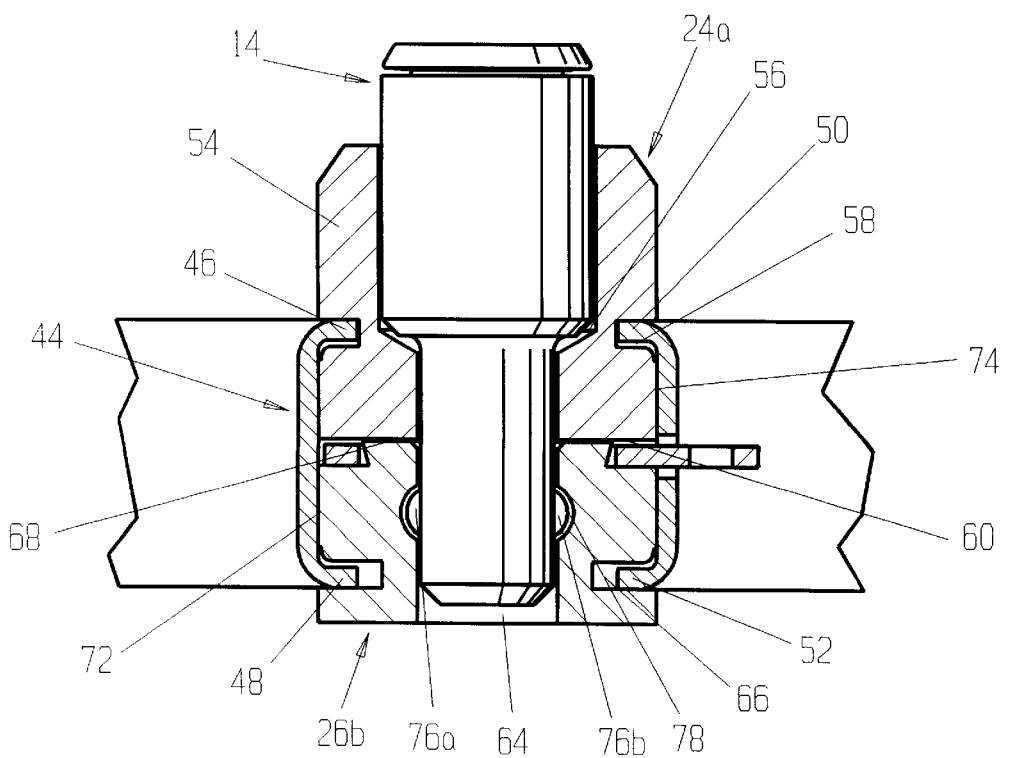
FIG. 5 shows a cross sectional view of one set of the preferred embodiment locking ring ends in the closed position with a barrel lock installed.

Referring to FIGS. 2 and 3, the locking ring of the present invention comprises two semi-annular split ring portions 22a and 22b, two front housings 24a and 24b, and two rear housings 26a and 26b. Referring also to FIG. 4, each semi-annular split ring portion also includes L-shaped wall portions such as 28 and 30 on its clockwise-most and counter-clockwise-most ends, respectively. The longer legs 32 and 34 of the wall portions 28 and 30 extend generally radially outward, while the shorter legs 36 and 38 extend perpendicularly to the longer legs and toward the open side of the ring portion. The longer legs and shorter legs combine to form two generally rectangular partial enclosures. Referring to FIG. 4, the shorter legs 36 and 38 end in serrations 40 and 42 which impede the insertion of a straight edged prying tool such as a screw driver between them. When the two halves of the locking ring are brought together to form a full circle, the complimentary serrations on the end portions intermesh at two diametrically opposed locations. Referring to FIG. 5, the U-shaped cross section 44 of the split ring material continues throughout each L-shaped protrusion, so that each counter-clockwise-most wall portion has a front lip such as 46 and a rear lip such as 48. Similarly, each clockwise-most wall portion has a front lip such as 50 and a rear lip such as 52. Thus there are internal lips on both the front and rear perimeters of both rectangular enclosures defined by the L-shaped wall portions.

Referring to FIGS. 4 and 5, each front housing such as 24a has a lock guard portion 54, a lock receiving hole 56, an external groove 58, and a rear face 60. Each front housing combines with one of the clockwise-most L-shaped wall portions such as 28 to form a clockwise-most end protrusion such as 62. Each rear housing such as 26b has a lock receiving hole 64, an external groove 66, and a front face 68. Each rear housing combines with a counter-clockwise-most L-shaped wall portion such as 30 to form a counter-clockwise-most end protrusion such as 70. Each housing has the same general shape as one of the rectangular enclosures, and the axis of each lock receiving hole is generally parallel to the central axis of the assembled meter ring. As shown in FIG. 5, each rear housing is permanently attached, by welding or other suitable means, to one of the counter-clockwise-most wall portions, generally at 72. In this configuration, the rear internal lip 48 fits into the external groove 66 of the rear housing. Similarly, each front housing is permanently attached to one of the clockwise-most wall portion, generally at 74, with the front internal lip 50 fitting into the external groove 58 of the front housing. In other embodiments, each of the end protrusions 62 and 70 could be formed as a single component.

Referring to FIGS. 4 and 5, when the two halves of the locking ring are brought together to form a full circle, the end protrusions and are brought together, and the locking ring is said to be in the closed state and cannot be removed from the meter. In this state, the external groove 58 in each front housing receives the front internal lip 46 from the counter-clockwise-most L-shaped protrusion, and the external groove 66 in each rear housing receives the rear internal lip 52 from the clockwise-most L-shaped protrusion. Thus, each of the internal lips is shielded from access, such that a prying tool cannot be inserted between any of the internal lips and any housing. In the closed state, the rear face 60 of each front housing is shielded by a rear housing, and the front face 68 of each rear housing is shielded by a front housing. Also, the seam between each set of front and rear housing is covered by the wall portions, such that a prying tool cannot be inserted between the front and rear housings.

When the locking ring is installed on the meter, the two halves of the locking ring are brought together to form a full circle, and each front housing such as 24a slides over the rear housing such as 24b on the other ring half until the lock receiving holes 56 and 64 in the housings align to receive the barrel lock 14, as shown in FIG. 5. When the locks are installed and locked, the locking balls 76a and 76b extend into the internal ball groove 78 of each rear housing, and the locking ring is locked in the closed state. When a barrel lock is removed from either set of housings, the meter ring can be opened at that location, and the ring can be removed from the meter.

ALTERNATIVE EMBODIMENTS

Figure 6:
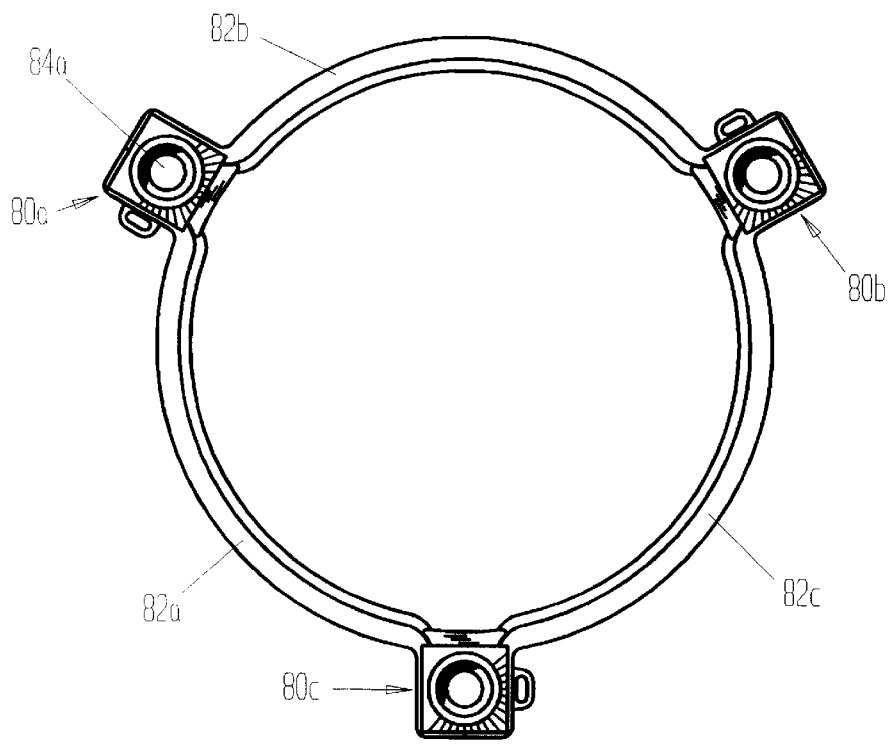
FIG. 6 shows a top view of an alternative embodiment locking ring having three lock receptacle and three ring portions.
Figure 7:
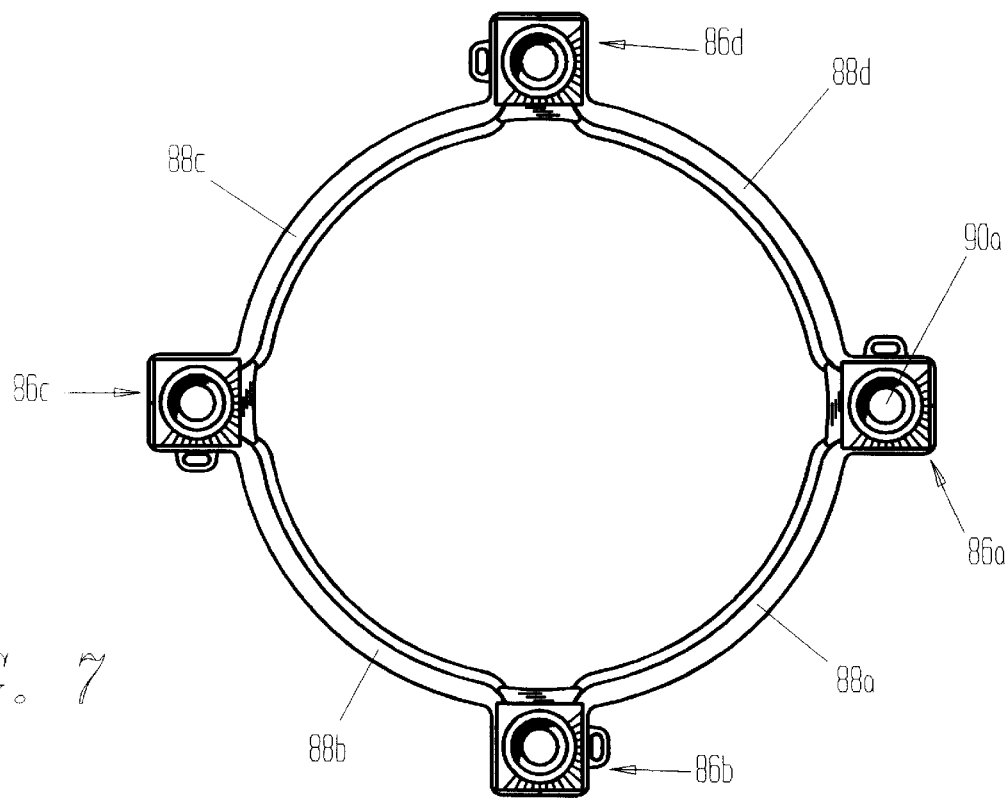
FIG. 7 shows a top view of an alternative embodiment locking ring having four lock receptacles and four ring portions.

FIG. 6 shows an alternative embodiment meter ring adapted to receive three barrel locks. This embodiment comprises three housing assemblies 80a, 80b, and 80c, and three ring portions 82a, 82b, and 82c. Each housing assembly has an aperture such as 84a therein for receiving a barrel type lock. When a barrel lock is removed from any of the housing assemblies, the meter ring can be opened at that location, and the meter ring can be removed from the meter. The meter ring shown has a housing assembly similar to the preferred embodiment. In other embodiments, the meter ring could have any housing assembly which is adapted to receive a barrel type lock, and is openable upon removal of the lock. FIG. 7 shows an alternative embodiment meter ring adapted to receive four barrel locks. This embodiment comprises four housing assemblies 86a, 86b, 86c, and 86d and four ring portions 88a, 88b, 88c, and 88d. Each housing assembly has an aperture such as 90a therein for receiving a barrel type lock. When a barrel lock is removed from any of the housing assemblies, the meter ring can be opened at that location, and the meter ring can be removed from the meter. In other embodiments, any number of housing assemblies and ring portions may be used to achieve the objects of the present invention.

Figure 8:
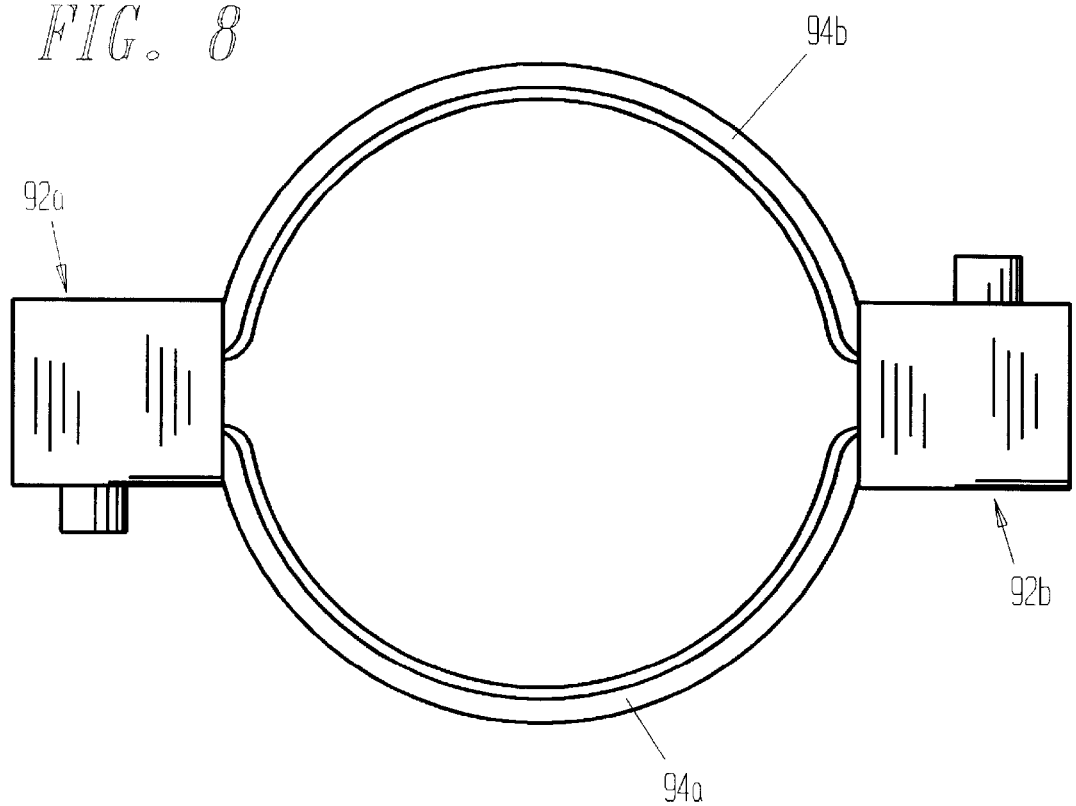
FIG. 8 shows a top view of an alternative embodiment locking ring having retaining screws and separate protective housings.
Figure 9:
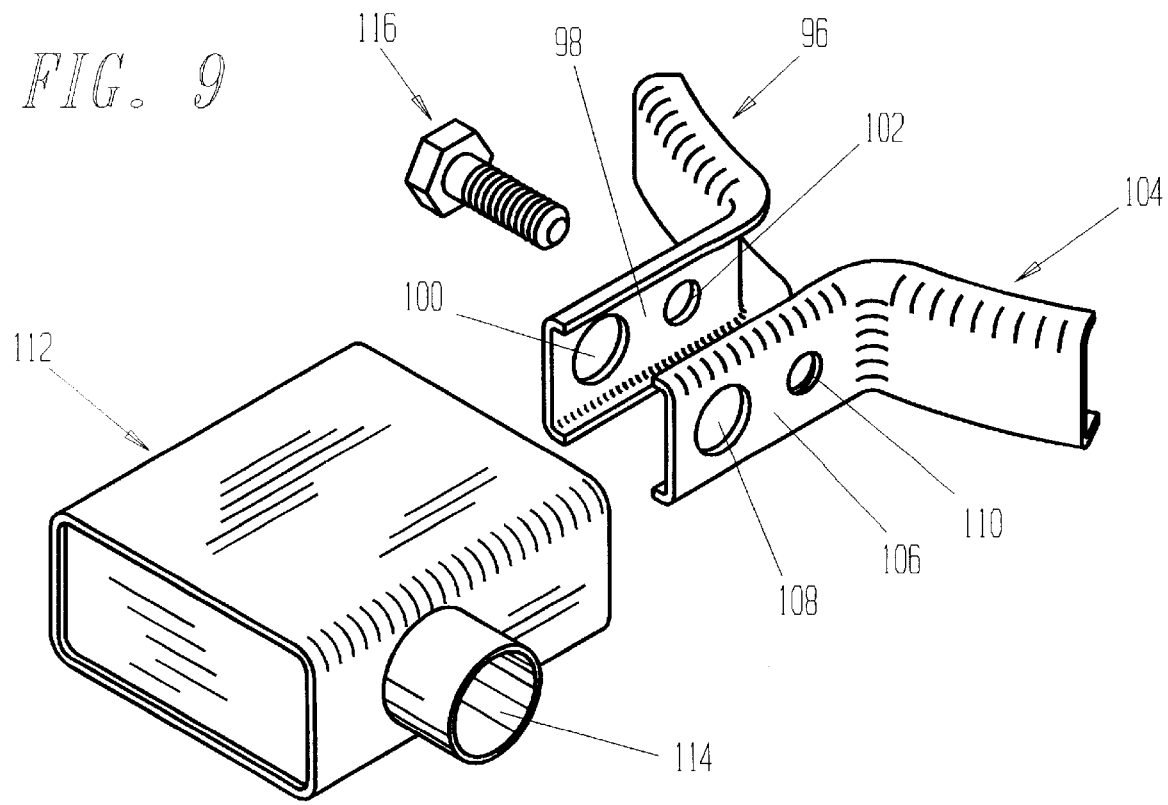
FIG. 9 shows an exploded isometric view of one set of ring ends of the alternative embodiment locking ring shown in FIG. 8.

FIG. 8 shows an alternative embodiment meter ring having a housing assembly similar to the screw retained ring shown in U.S. Pat. No. 4,008,585 (1977, Lundberg). This embodiment comprises two housing assemblies 92a and 92b, and two ring portions 94a and 94b. Referring to FIG. 9, the counter-clockwise-most end 96 of each ring portion terminates in a radially extending projection 98 having a lock receiving aperture 100 and a screw receiving aperture 102 therethrough. The clockwise-most end 104 of each ring portion terminates in a radially extending projection 106 having a lock receiving aperture 108 and a tapped hole 110 therethrough. Each housing assembly includes a separate protective enclosure 112 with a lock receiving bore 114 therein. When the meter ring is installed on the meter, at each set of ring ends a screw 116 is passed through the screw receiving aperture 102 and is threaded into the tapped hole 110 until the meter ring is tight on the meter. The protective enclosure 112 is then placed over the projections 98 and 106 until the lock receiving bore 114 in the enclosure is in axial alignment with the lock receiving apertures 100 and 108 in the projections. A barrel lock is then inserted into the lock receiving hole 114 and lock receiving apertures 100 and 108 to prevent removal of the protective enclosure 112, and thereby prevent access to the screw 116. When a barrel lock is removed from either of the housing assemblies 92a or 92b, the protective enclosure 112 can be removed. The screw 116 can then be removed from the ring and the meter ring can be removed from the meter. In other embodiments, any number of housing assemblies and ring portions may be used to achieve the objects of the present invention.

Figure 10:
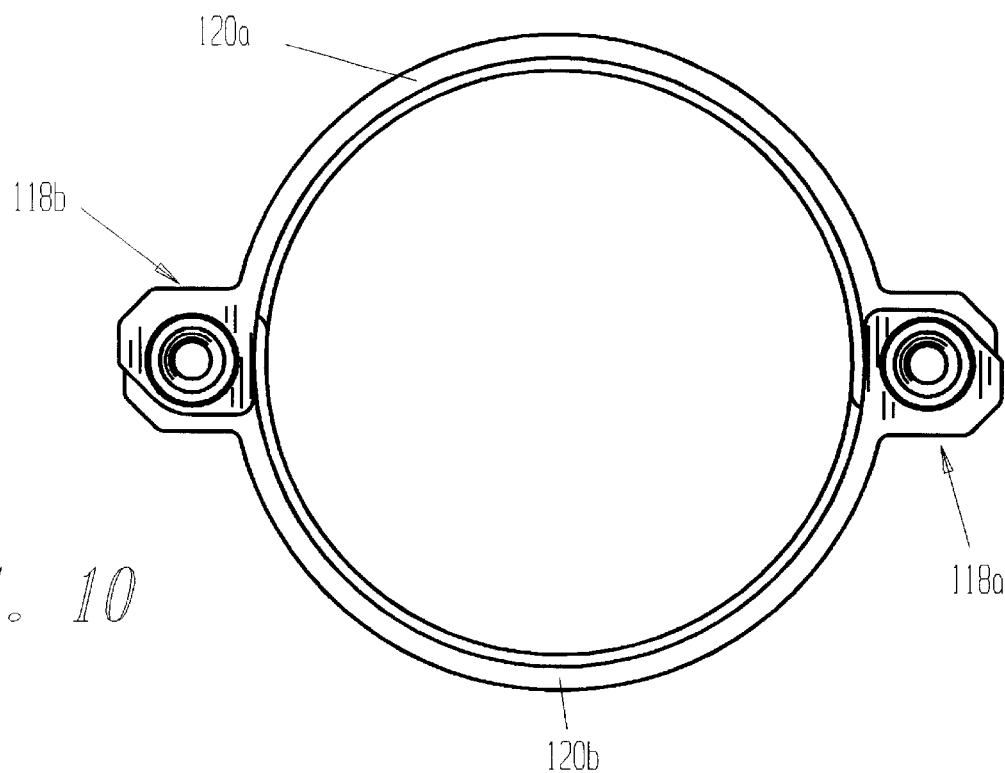
FIG. 10 shows a top view of an alternative embodiment locking ring having a male/female end configuration.
Figure 11:
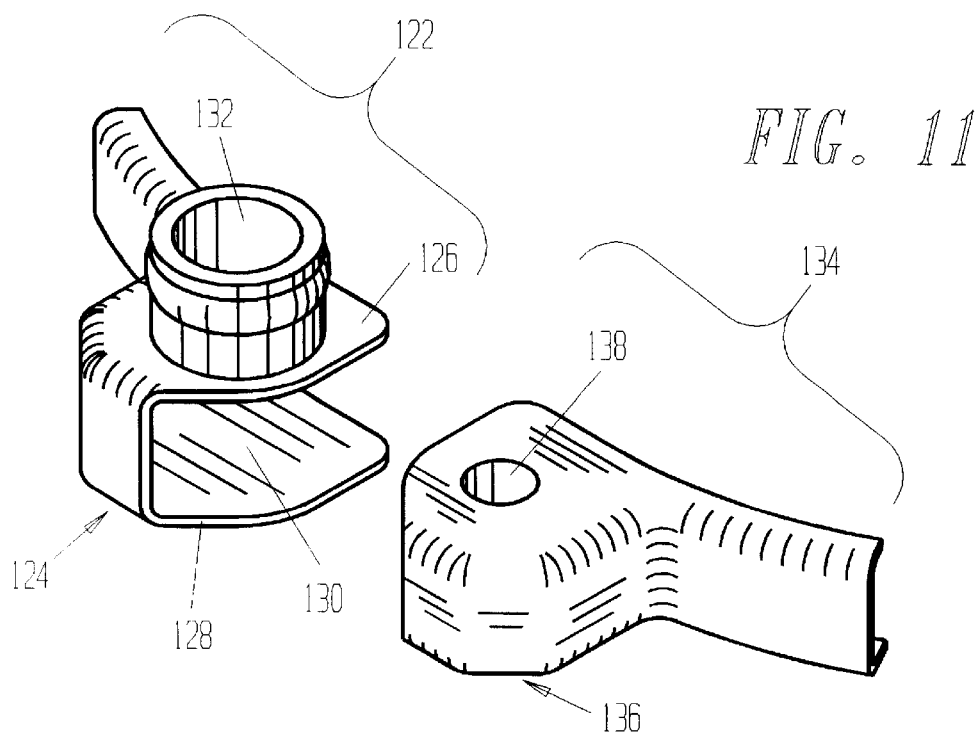
FIG. 11 shows an exploded isometric view of one set of ring ends of the alternative embodiment locking ring shown in FIG. 10.

FIG. 10 shows an alternative embodiment meter ring having a male/female housing assembly similar to the meter ring shown in U.S. Pat. No. 4,828,300 (1989, Agbay). This embodiment comprises two housing assemblies 118a and 118b, and two ring portions 120a and 120b. Referring to FIG. 11, the counter-clockwise-most end 122 of each ring portion terminates in a radially extending female projection 124 having upper and lower plate portions 126 and 128 respectively, and a cavity 130 disposed between said plate portions. The female projection 124 also includes a lock receiving aperture 132. The clockwise-most end 134 of each ring portion terminates in a radially extending male projection 136 having a lock receiving aperture 138. When the two halves of the meter ring are brought together to form a full circle, each male projection 136 is inserted into the cavity 130 of the respective female projection 124, until the lock receiving apertures 132 and 138 are in axial alignment. A barrel lock can then be installed into each housing assembly to prevent separation of the male and female projections. When a barrel lock is removed from either of the housing assemblies, the meter ring can be opened at that location, and the meter ring can be removed from the meter. In other embodiments, any number of housing assemblies and ring portions may be used to achieve the objects of the present invention.

Figure 12:
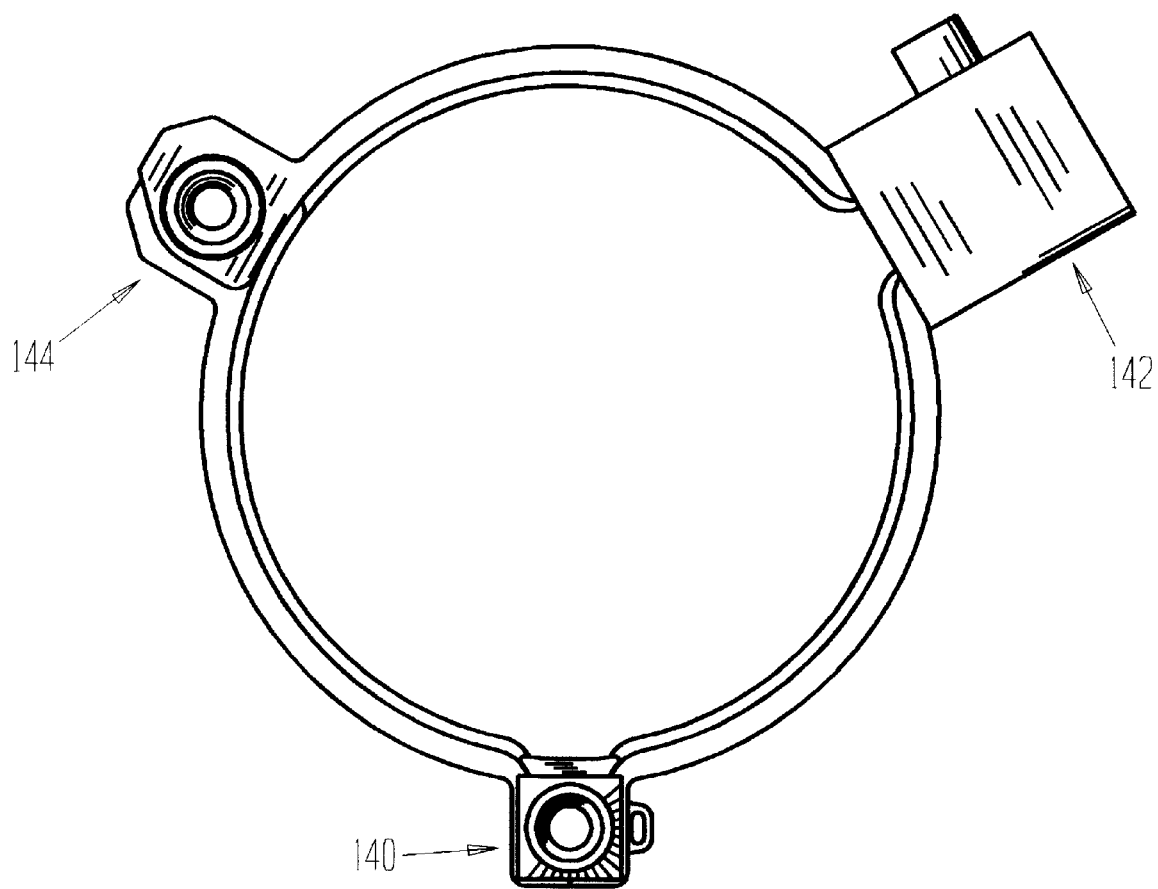
FIG. 12 shows a top view of an alternative embodiment locking ring having three differing end configurations and three ring portions.

FIG. 12 shows an alternative embodiment meter ring having three different types of housing assemblies and three ring portions. This embodiment comprises a housing assembly 140 which is similar to the preferred embodiment, a screw retained housing assembly 142 which is similar to the embodiment shown in FIG. 9, and a male/female housing assembly 144 which is similar to the embodiment shown in FIG. 11. When a barrel lock is removed from any of the housing assemblies, the ring can be opened at that location in the manner described above, and the meter ring can be removed from the meter. In other embodiments, any number and combination of different types of housing assemblies may be used to achieve the objects of the present invention.

FIG. 13 shows an alternative embodiment meter ring having a one piece ring portion 146 and a housing assembly 148 with two lock receiving openings 150 and 152 extending generally parallel to the axis of the ring portion. Referring to FIG. 14, the housing assembly comprises a left front housing 154 having a lock receiving aperture 156, a right front housing 158 having a lock receiving aperture 160, and a rear housing 162 having two lock receiving apertures 164 and 166 with internal grooves 168 and 170 adapted to engage the locking means 76a and 76b of the barrel locks 14. The left front housing 154 is welded or otherwise permanently attached the ring portion 146 at 172. The right front housing 158 is welded or otherwise permanently attached the ring portion at 174. The rear housing 162 is free floating and is not attached to the ring. When the meter ring is closed, the lock receiving aperture 156 in the left front housing 154 is in axial alignment with the lock receiving aperture 164 in the rear housing 162. Similarly, the lock receiving aperture 160 in the right front housing 158 is in axial alignment with the lock receiving aperture 166 in the rear housing. The barrel locks can then be inserted into the combined apertures 150 and 152. Referring to FIG. 15a, when the left-most barrel lock is removed, the left front housing 154 can be separated from the right front housing 158 and the rear housing 162, allowing the meter ring to be opened and removed from the meter. Referring to FIG. 15b, when the right-most barrel lock is removed, the right front housing 158 can be separated from the left front housing 154 and the rear housing 162, allowing the meter ring to be opened and removed from the meter.

FIG. 16 shows an alternative embodiment meter ring having a one piece ring portion 176, a left housing 178 having a transverse lock receiving aperture 180, a right housing 182 having a transverse lock receiving aperture 184, and a center housing 186 having two transverse lock receiving apertures 188 and 190 with internal grooves 192 and 194 adapted to engage the locking means 76a and 76b of the barrel locks 14. The left housing 178 is welded or otherwise permanently attached the ring portion at 196. The right housing 182 is welded or otherwise permanently attached the ring portion at 198. The center housing 186 is free floating and is not attached to the ring. When the meter ring is closed, the lock receiving aperture 180 in the left housing 178 is in axial alignment with the lock receiving aperture 188 in the center housing 186. Similarly, the lock receiving aperture 184 in the right housing 182 is in axial alignment with the lock receiving aperture 190 in the center housing. The barrel locks 14 can then be inserted into the aligned apertures. Referring to FIG. 17a, when the left-most barrel lock is removed, the left housing 178 can be separated from the right housing 182 and the center housing 186, allowing the meter ring to be opened and removed from the meter. Referring to FIG. 17b, when the right-most barrel lock is removed, the right housing 182 can be separated from the left housing 178 and the center housing, allowing the meter ring to be opened and removed from the meter.

FIG. 18 shows an alternative embodiment meter ring having a one piece ring portion 200 and a housing assembly 202 having two lock receiving openings 204 and 206 extending generally parallel to the axis of the ring portion. Referring to FIG. 19, the housing assembly comprises a front housing 208 having two lock receiving apertures 210 and 212, and a rear housing 214 having two lock receiving apertures 216 and 218 with internal grooves adapted to engage the locking means of a barrel lock in a manner which is well known. The front housing 208 is welded or otherwise permanently attached the ring portion at 220. The rear housing 214 is welded or otherwise permanently attached the ring portion at 222. When the meter ring is closed, the front housing 208 slides over the rear housing 214 in a manner similar to the preferred embodiment. The lock receiving apertures 210 and 212 in the front housing are in axial alignment with the lock receiving apertures 216 and 218 in the rear housing, and a barrel lock can then be inserted into each set of combined apertures 204 and 206. In this embodiment, the barrel locks must be removed from both sets of combined apertures in order to allow the meter ring to be opened and removed from the meter. In other embodiments any number of locks and apertures may be used to achieve the objects of the present invention.

FIGS. 20 and 21 show an alternative embodiment meter ring having a one piece ring portion 224, a left housing 226, and a right housing 228. The left housing 226 has two transverse lock receiving apertures 230 and 232. The upper lock receiving aperture 230 has an internal groove 234 adapted to engage the locking means 76a and 76b of the barrel lock 14. The right housing 228 also has two transverse lock receiving apertures 236 and 240. The lower lock receiving aperture 240 has an internal groove 242 adapted to engage the locking means of the barrel lock. The left housing 226 is welded or otherwise permanently attached the ring portion at 244. The right housing 228 is welded or otherwise permanently attached the ring portion at 246. When the meter ring is closed, the lock receiving apertures 230 and 232 in the left housing are in axial alignment with the lock receiving apertures 236 and 240 in the right housing, and a barrel lock 14 can then be inserted into each set of aligned apertures. In this embodiment, the barrel locks must be removed from both sets of aligned aperture in order to allow the meter ring to be opened and removed from the meter. In other embodiments any number of locks and apertures may be used to achieve the objects of the present invention.

Conclusions, Ramifications, and Scope of the Invention

The present invention is well adapted to carry out the objects and attain the ends and advantages mentioned, as well as others inherent therein. The locking ring of present invention is of a simple design, and is constructed using a minimal number of components and attachment operations. The locking ring of the present invention is adapted to receive a plurality of barrel locks. The locking can be opened by removing one or several of the barrel locks, allowing independent access to electricity meters by several entities, while still providing a high level of security. Other locking ring embodiments are presented which require removal of two or more barrel locks prior to opening, providing joint access to the meter where desired. While, for the purposes of disclosure there have been shown and described what are considered at present to be the preferred embodiments of the present invention, it will be appreciated by those skilled in the art that other uses may be resorted to and changes may be made to the the details of construction, combination of shapes, size or arrangement of the parts, or other characteristics without departing from the spirit and scope of the invention. It is therefore desired that the invention not be limited to these embodiments and it is intended that the appended claims cover all such modifications as fall within the true spirit and scope of the invention.

What is claimed is:

1. A locking ring for detachably interconnecting two axially aligned, radially extending circular flanges, said locking ring including:

a) an annular ring comprising a plurality of arcuate ring sections, said ring sections being arranged to form a substantially complete annulus, each said ring section having a generally U-shaped cross section comprising an outer wall and two flanges, said flanges extending radially inward toward the center of said annular ring, each said ring section having a first end and a second end, the first end of each ring section being proximate to the second end of the ring section immediately adjacent in one angular direction, and the second end of each ring section being proximate to the first end of the ring section immediately adjacent in the other angular direction;

b) a plurality of housing portions, the number of said housing portions being equal to the number of said ring sections, each said housing portion being interposed generally between an adjacent pair of said ring sections, each said housing portion being adapted to prevent separation of said first and second ends of said adjacent ring sections, and each said housing portion including at least one aperture therein for receiving a barrel type lock; and c) a plurality of barrel type locks, the number of said locks at least equaling the number of said housing portions, each said lock being inserted into one of said apertures in said housing portions, and each said lock comprising a head portion, a shank portion smaller in diameter than said head portion, and retaining means retractable extending from said shank portion.

2. The locking ring of claim 1, comprising exactly two ring sections and two housing portions.

3. The locking ring of claim 1, comprising exactly three ring sections and three housing portions.

4. The locking ring of claim 1, comprising exactly four ring sections and four housing portions.

5. The locking ring of claim 1, wherein:
a) at least one of said housing portions comprises a first end protrusion extending generally radially outward from said first end of one of said adjacent ring sections, and a second end protrusion extending generally radially outward from said second end of the other of said adjacent ring ends;
b) said annular ring has a central axis, a front side defined by the furthest extent of said annular ring along said axis in one direction, and a rear side defined by the furthest extent of said annular ring along said axis in the opposite direction;
c) said first end protrusion includes a front housing located generally at said front side of said annular ring, said front housing having a rear face located on the surface of said front housing closest to said rear side of said annular ring, and said front housing having a first aperture therethrough, said first aperture extending generally parallel to said axis of said annular ring;
d) said second end protrusion includes a rear housing located generally at said rear side of said annular ring, said rear housing having a front face located on the surface of said rear housing closest to said front side of said annular ring, and said rear housing having a second aperture therethrough, said second aperture extending generally parallel to said axis of said annular ring;
e) said front housing and said rear housing overlap each other when said end protrusions are moved together, such that:
i) said rear housing at least partially shields said rear face of said front housing,
ii) said front housing at least partially shields said front face of said rear housing, and
iii) said first aperture and said second aperture are in substantial axial alignment for receiving a barrel type lock.

6. The locking ring of claim 5, wherein said first end protrusion further includes a first wall portion extending rearwardly from said front housing, said second end protrusion further includes a second wall portion extending forwardly from said rear housing, said front housing and said rear housing form a seam between said front face and said rear face when said end protrusions are moved together, and said wall portions of said end protrusions at least partially cover said seam when said end protrusions are moved together.

7. The locking ring of claim 6, wherein each of said front and rear housings further comprises an external groove, and each of said first and second wall portions further includes an internal lip portion disposed generally at a right angle thereto, such that when said end protrusions are moved together said internal lip portion of said first wall portion fits into said external groove of said rear housing, and said internal lip portion of said second wall portion fits into said external groove of said front housing.

8. The locking ring of claim 7, wherein:
a) each of said first and second wall portions is generally L-shaped and includes a radial leg extending generally radially outward from said annular ring, and a tangential leg extending generally tangentially to said annular ring and towards the opposite said end protrusion;
b) each of said front and rear housing portions is generally rectangular; and
c) said wall portions include terminating serrations which intermesh when said end protrusions are moved together.

9. The locking ring of claim 1, wherein at least one of said housing portions comprises:
a) a first projection extending generally radially outward from said first end of one of said adjacent ring sections, said first projection having a first aperture therethrough;
b) a second projection extending generally radially outward from said second end of the other of said adjacent ring sections;
c) a generally cup shaped housing adapted to enclose said first and second projections, said housing having a second aperture positioned to be aligned with said first aperture in said first projection for receiving a barrel type lock.

10. The locking ring of claim 9, further comprising:
a) a third aperture in one of said projections;
b) a tapped hole in the other of said projections, said tapped hole being positioned to be aligned with said third aperture; and
c) a screw adapted to pass through said third aperture and engage said threaded hole, thereby preventing separation of said first and second projections.

11. The locking ring of claim 1, wherein at least one of said housing portions comprises:
a) a female end protrusion extending generally radially outward from said first end of one of said adjacent ring sections, said female end protrusion comprising a front portion with a first aperture therethrough, a rear portion, and a cavity interposed between said front portion and said rear portion; and
b) a male end protrusion extending generally radially outward from said second end of the other of said adjacent ring ends, said male end protrusion having a second aperture therethrough, and said male end protrusion being insertable into said cavity, said second aperture being positioned to be aligned with said first aperture for receiving a barrel type lock.

6,032,989

11

\* \* \* \* \*

UNITED STATES PATENT AND TRADEMARK OFFICE
CERTIFICATE OF CORRECTION

PATENT : 6,032,989

Dated : March 7, 2000

INVENTOR(S) : Norman Binz DeWalch

It is certified that error appears in the above-identified patent and that said Letters Patent is hereby corrected as shown below:

On the title page, item [76] Inventors: should read as follows:
--[76] Inventor: Norman Binz DeWalch, 3179 Las Palmas, Houston, Tex.--.

Signed and Sealed this

Twelfth Day of December, 2000

*Attest:*

Q. TODD DICKINSON

*Attesting Officer*            *Director of Patents and Trademarks*